United States Patent [19]

Malinowski et al.

[11] 4,384,365
[45] May 17, 1983

[54] SUPERHETERODYNE RECEIVER FREQUENCY TRACKING CIRCUIT

[75] Inventors: Christopher W. Malinowski, Untereisesheim; Heinz Rinderle, Heilbronn, both of Fed. Rep. of Germany

[73] Assignee: Licentia Patent-Verwaltungs-G.m.b.H., Frankfurt am Main, Fed. Rep. of Germany

[21] Appl. No.: 245,603

[22] Filed: Mar. 19, 1981

Related U.S. Application Data

[63] Continuation of Ser. No. 44,967, Jun. 4, 1979, Pat. No. 4,306,310, which is a continuation-in-part of Ser. No. 957,006, Nov. 2, 1978.

[30] Foreign Application Priority Data

| Oct. 16, 1978 | [DE] | Fed. Rep. of Germany | 2844936 |
| Oct. 16, 1978 | [DE] | Fed. Rep. of Germany | 2844938 |
| Oct. 16, 1978 | [DE] | Fed. Rep. of Germany | 2844939 |
| Oct. 16, 1978 | [DE] | Fed. Rep. of Germany | 2845005 |
| Oct. 16, 1978 | [DE] | Fed. Rep. of Germany | 2845006 |
| Dec. 28, 1978 | [DE] | Fed. Rep. of Germany | 2856397 |

[51] Int. Cl.³ .............................................. H04B 1/26
[52] U.S. Cl. .................................. 455/183; 455/192; 455/197; 455/260; 331/2; 331/18
[58] Field of Search .............. 455/164, 182, 165, 183, 455/192, 195, 196–199, 207, 208, 259, 260, 264; 334/15; 331/1 A, 2, 18, 25

[56] References Cited

U.S. PATENT DOCUMENTS

| 3,189,829 | 6/1965 | Bento et al. | 455/164 |
| 3,249,876 | 5/1966 | Harrison | 455/183 |
| 3,758,865 | 9/1973 | McKibben | 455/195 |
| 3,845,393 | 10/1974 | Basset | 455/183 |

Primary Examiner—Jin F. Ng
Attorney, Agent, or Firm—Spencer & Kaye

[57] ABSTRACT

In a superheterodyne signal receiver including an input circuit arranged to be tuned to a frequency to be received and including a signal controllable variable reactance element presenting a reactance whose value is adjusted by a tuning signal and determines the frequency to which the input circuit is tuned, and a controllable local oscillator producing an alternating signal to be mixed with a received signal to produce an intermediate frequency received signal, a tracking circuit composed of: a first frequency control circuit including the local oscillator; a second frequency control circuit including a controllable sampling oscillator and a member connected to respond to the frequency of the output from the sampling oscillator to derive a signal related thereto and supplying that signal, as the tuning signal, to the controllable element; and a control signal generating unit generating first and second control signals and connected for supplying the first control signal to the first frequency control circuit for adjusting the frequency of the signal produced by the local oscillator, and for supplying the second control signal to the second frequency control circuit for adjusting the value of the tuning signal to tune the input circuit to a selected frequency, the generating unit maintaining a relationship between the first and second control signals such that the output frequency of the local oscillator is adjusted to the value corresponding to the received signal frequency to which the input circuit is tuned.

6 Claims, 19 Drawing Figures

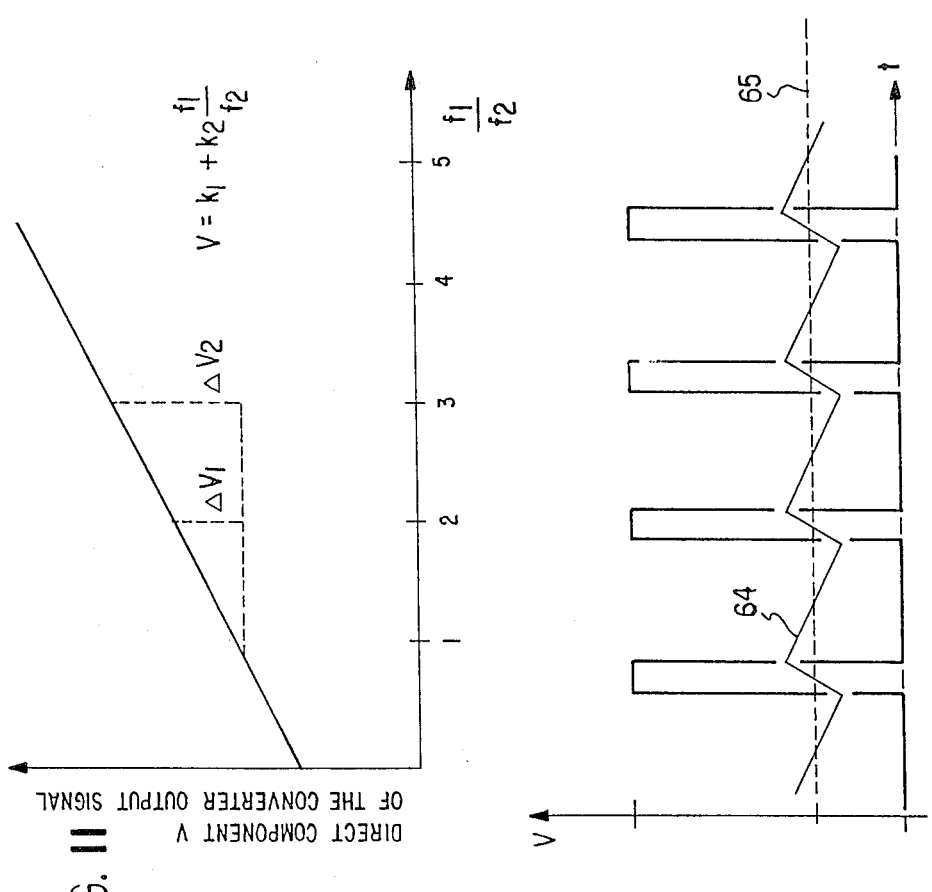
FIG. 11
FIG. 12
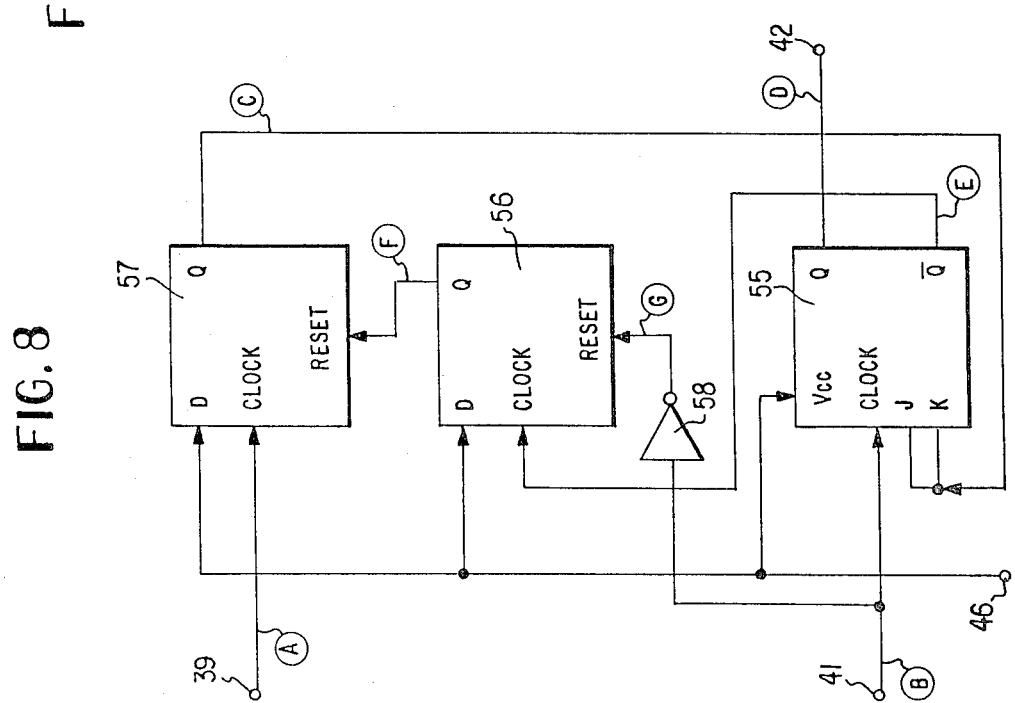
FIG. 8

SUPERHETERODYNE RECEIVER FREQUENCY TRACKING CIRCUIT

CROSS-REFERENCE TO RELATED APPLICATION

The present application is a continuation of application Ser. No. 044,967, filed June 4, 1979, now U.S. Pat. No. 4,306,310, which is a continuation-in-part of application Ser. No. 957,006 filed Nov. 2, 1978.

BACKGROUND OF THE INVENTION

It is known that frequency synchronism must exist between the oscillator and the input circuit of a superheterodyne receiver.

In order to attain the required synchronism between oscillator and input circuit, various techniques are employed. For example, it can be attempted to achieve the desired synchronism by specially cutting the discs of the rotary tuning capacitor. However, for electronic tuning systems varactor diodes which have specially adapted capacitance/voltage characteristics are not available. For this reason, tuning systems with varactor diodes employ the known three-point tracking which, however, permits optimum tracking, or synchronization only at three points of the frequency range. Even with precisely identical characteristics of the tuning elements or diodes, there occur synchronization deviations which result in sensitivity breaks within the tuning range. Moreover, inequality of the characteristics and deviations in the capacitance value of the padding capacitor produce additional deviations and thus increase the problem.

SUMMARY OF THE INVENTION

Objects of the present invention are to provide improved synchronization compared to the known tracking circuits and to eliminate the deviations which, when three-point synchronization is employed, inherently occur in such known circuits across the tuning frequency band.

This and other objects are achieved, according to the present invention, by the provision, in or for a superheterodyne signal receiver including an input circuit arranged to be tuned to a frequency to be received and including a signal controllable variable reactance element presenting a reactance whose value is adjusted by a tuning signal and determines the frequency to which the input circuit is tuned, and a controllable local oscillator producing an alternating signal to be mixed with a received signal to produce an intermediate frequency received signal, of a tracking circuit composed of: a first frequency control circuit including the local oscillator; a second frequency control circuit including a controllable sampling oscillator and means connected to respond to the frequency of the output from the sampling oscillator to derive a signal related thereto and supplying that signal, as the tuning signal, to the controllable element; and control signal generating means generating first and second control signals and connected for supplying the first control signal to the first frequency control circuit for adjusting the frequency of the signal produced by the local oscillator, and for supplying the second control signal to the second frequency control circuit for adjusting the value of the tuning signal to tune the input circuit to a selected frequency, the control signal generating means maintaining a relationship between the first and second control signals such that the output frequency of the local oscillator is adjusted to the value corresponding to the received signal frequency to which the input circuit is tuned.

BRIEF DESCRIPTION OF THE DRAWING

FIG. 8 is a block circuit diagram of a preferred embodiment of a component of the device of FIG. 7.

FIG. 11 is a diagram illustrating the operating characteristics of the circuit of FIGS. 6 and 7.

FIG. 12 is a signal diagram illustrating the operation of a component of the device of FIGS. 6 and 7.

DESCRIPTION OF THE PREFERRED EMBODIMENTS

Figure 1:
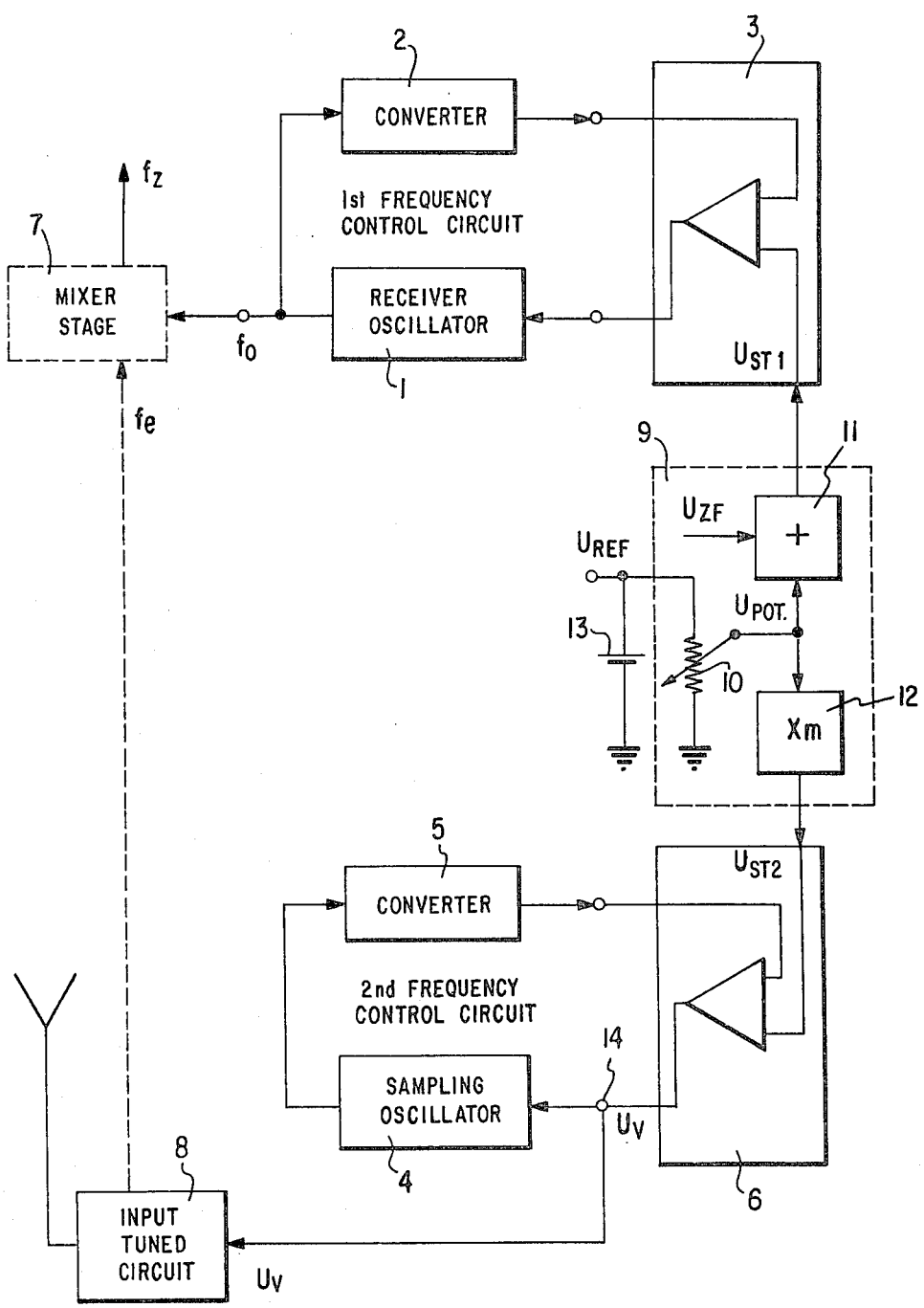
FIGS. 1 and 2 are block circuit diagrams of two preferred embodiments of tracking circuits according to the present invention.

The sync circuit of FIG. 1 is composed of two frequency control circuits. The first frequency control circuit generates an A.C. signal at the oscillator frequency $f_o$, which together with the received signal at frequency $f_e$, selected by tuning an input tuned circuit 8 to that frequency, is fed to a mixer stage 7 of a superheterodyne receiver of known design. The oscillator signal at frequency $f_o$ produced by an oscillator 1 of the first frequency control circuit is of particular significance since the goal is to have the oscillator frequency $f_o$ relate to the received frequency $f_e$ of the receiver according to the relationship $$f_e = f_o \pm f_z,$$

were $f_z$ is the intermediate frequency of the superheterodyne receiver.

It is the purpose of the sync circuit according to the invention to make the resonant frequency of the resonant circuit of the input tuned circuit 8 identical with the received frequency $f_e$, according to the above equation, over the entire tuning frequency range, the received frequency then differing from the oscillator frequency $f_o$ by the intermediate frequency $f_z$. Care must therefore be taken to make this resonant frequency identical with the respective received frequency over the entire tuning frequency range.

The first frequency control circuit includes the oscillator 1, a converter 2 and a comparator 3. The second frequency control circuit which generates a control voltage $U_V$ for the reactance element of the input tuned circuit 8, includes a sampling oscillator 4, a converter 5 and a comparator 6.

The converters 2 and 5 produce a direct output signal linearly proportional to the frequency of the input signal thereto. Devices having this characteristic are well known in the art and are employed extensively in, for example, FM receivers as signed demodulators. The two frequency control circuits are each actuated at a respective input by a common control arrangement 9 via respective comparators 3 and 6. Each comparator 3 and 6 is constituted, in its simplest form, by an operational amplifier.

In the embodiment shown in FIG. 1, the control arrangement 9 includes a manually adjustable potentiometer 10, and an adder 11 and a multiplier 12, each having one input connected to the movable tap of potentiometer 10. A voltage $U_{ref}$ is applied across potentiometer 10 from a voltage source 13. Multiplier 12 is set to multiply the voltage $U_{pot}$ at the tap of potentiometer 10 by a fixed magnitude.

In the first frequency control circuit, oscillator 1 is controllable over a frequency range which is offset with respect to the receiving frequency range by a certain frequency, generally the intermediate frequency $f_z$. The oscillator frequency is determined, inter alia, by the reference voltage $U_{ref}$, by the setting of potentiometer 10 and, if necessary, by adjustment resistors connected to the potentiometer as well as by an offsetting voltage $U_{ZF}$ which is proportioned to the desired frequency offset and is added to or subtracted from the potentiometer voltage $U_{pot}$ in adder 11. The converters 2 and 5, as already mentioned, must meet the condition that a linear relationship exists between the frequency of their input signal and their output voltage.

The second frequency control circuit serves the purpose of generating the control signal, or voltage, $U_V$ for the reactance element of the resonant circuit of the input tuned circuit 8. The control signal $U_V$ must sweep over a certain operating range determined by the gain of the multiplier 12 as well as by the frequency determining elements, which include an inductance for capacitive tuning and a capacitance for inductive tuning, of the resonant circuit of oscillator 4. The gain m of the multiplier 12 must be selected so that the frequency $f_s$ of the oscillator 4 of the second frequency control circuit will not lie in the receiving range or in the range of the image frequency of the receiver. This can be accomplished with a gain m less than 1, equal to 1 or greater than 1.

It is known that the resonant frequency range of the resonant circuit of the input tuned circuit 8 must be equal to the receiving frequency range. After determining the operating range from $U_V$, this condition can be met by setting or selecting those elements of this resonant circuit which, although they help to determine the resonant frequency of this circuit, are not varied by the control signal $U_V$. These elements are set so that variation of $U_V$ will cause the resonant frequency range of the resonant circuit of the input tuned circuit 8 to sweep the predetermined receiving frequency range.

In each frequency control circuit, the converter 2 or 5 produces an output voltage which is linearly proportional to the frequency of its associated oscillator and supplies this voltage to one input of an associated operational amplifier in comparator 3 or 6. The output signal from each comparator is applied to its respective oscillator to vary the oscillator output in a direction to establish equality between the two operational amplifier input signals.

The control signal $U_V$ in the second frequency control circuit at the control input 14 of the oscillator 4 is fed to the input tuned circuit 8 as a control signal for tuning the reactance element or elements thereof. The oscillator 4 and the input tuned circuit 8 preferably contain the same reactance elements. in order that these reactance elements will have the same characteristics, if possible, they are preferably, if variable capacitance semiconductor diodes are used, elements of one and the same semiconductor chip. In the case where the characteristics of converters 2 and 5 are identical, oscillator 4 produces an output signal at a frequency equal to m times the received frequency $f_e$, where the gain of multiplier 12 is m, due to the linear characteristic of converter 5. Instead of multiplier 12 with a gain of m, a frequency divider (not shown) with a dividing ratio of m can also be provided between the oscillator 4 and the converter 5 to cause the frequency of the oscillator 4 to be a submultiple of $f_e$, and thus produce the same effect as multiplier 12.

In the operation of the tracking, or sync, circuit according to the invention it is only the quotient, or ratio, $f_s/f_e$ which must be maintained constant. Since this condition is met even if $f_s = m \cdot f_e$ where the frequency $f_s$ of the sampling oscillator 4 differs from the received frequency $f_e$, the possibility of setting the synchronism by multiplying or dividing the amplitude of the control signal $U_{pot}$, or the frequency of the sampling oscillator, respectively, is not affected thereby. Thus, as a result of multiplication of $U_{pot}$, the frequency of the sampling oscillator 4 can deviate considerably from the received frequency $f_e$. Nevertheless, the correct resonant frequency, which is equal to the received frequency, will be set, by adjusting of $U_{pot}$, in the resonant circuit of the input tuning circuit 8, since it is not absolute changes but relative changes in frequency that are involved. However, this does require linearity between voltage and frequency in the frequency control circuits, and such linearity is achieved by the circuit of FIG. 1.

Figure 2:
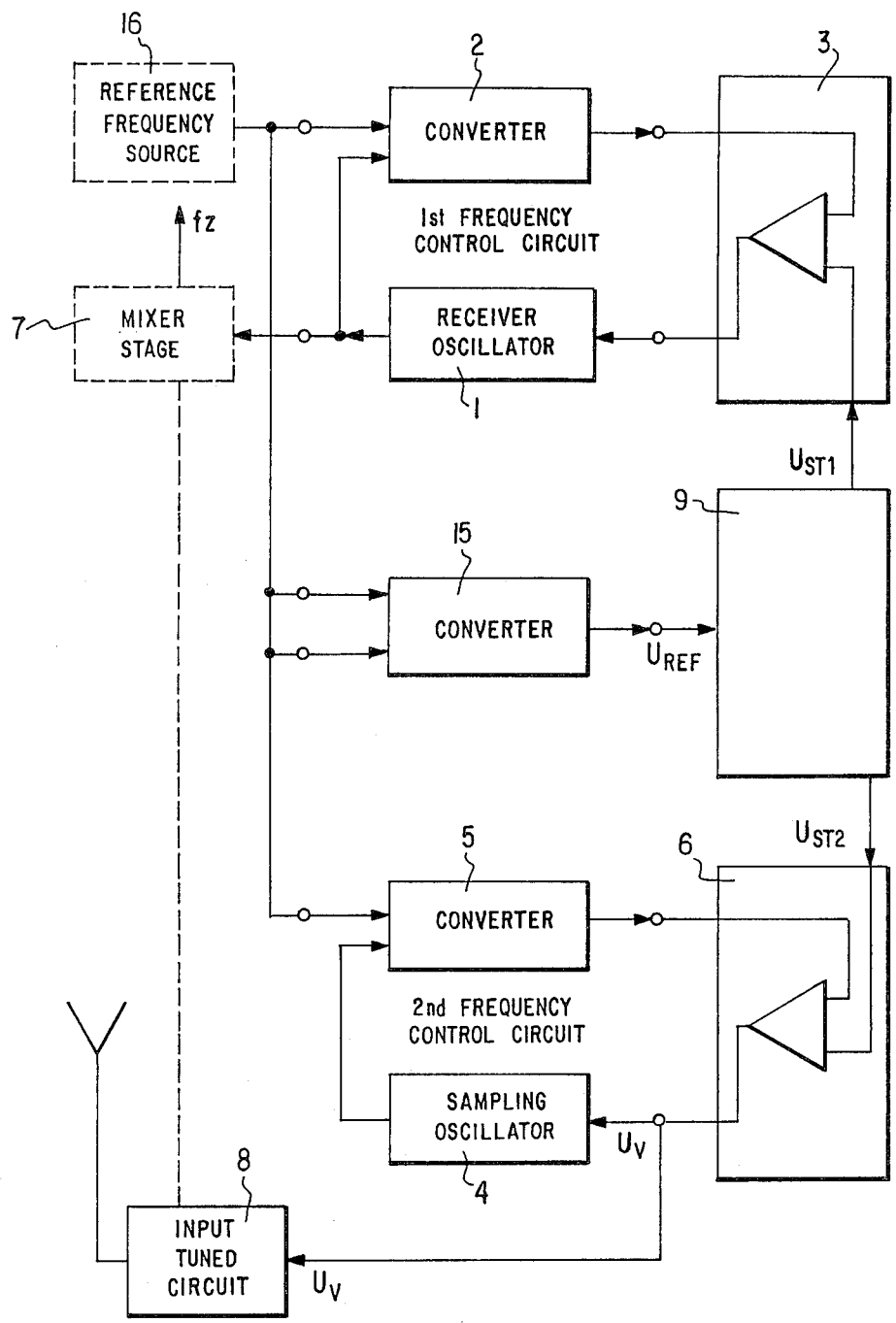

In the circuit arrangement of FIG. 2 a third frequency-to-voltage converter 15 is provided, in addition to the circuitry of FIG. 1, to furnish the reference voltage $U_{ref}$ for the control arrangement 9, which can be identical to that shown in FIG. 1. While the reference voltage source 13 of FIG. 1 keeps the reference voltage $U_{ref}$ constant, the converter 15 of FIG. 2 changes the reference voltage in such a way as to compensate, or nullify, undesirable changes in the characteristics of converters 2 and 5 produced by adverse influences, such as temperature changes, provided that converter 15 has the same characteristics as converters 2 and 5, and under the assumption that all converters are equally subjected to the same adverse influences.

In contradistinction to the converters of FIG. 1, the converters of FIG. 2 have two inputs. While one input of each of converters 2 and 5 receives a reference signal from a reference voltage source 16, the second input of each of converters 2 and 5 receives the output signal from its associated oscillator 1 or 4. Converter 15 receives the reference signal from the reference frequency source 16 at both of its inputs.

Converters 2, 5 and 15 are designed so that their output signal is a function of a frequency relationship between their input signals. Since for converter 15 the input frequencies are the same, the frequency relationship is 1 and thus, in contradistinction to the other converters, the output voltage of converter 15 is independent of the value of the reference frequency. The frequency from the reference frequency source can be used to set the operating range of the two frequency control circuits.

Since in the arrangement of FIG. 1 the reference voltage remains constant, the oscillator frequencies generated in the control circuits may change upon a change in converter characteristics due to adverse, e.g. temperature, influences. In contradistinction thereto, converter 15 in the arrangement of FIG. 2 takes care that such undesirable changes in the characteristics of converters 2 and 5 are compensated in that the output voltage of converter 15 changes in the same way so that is compensates for the negative influences on converters 2 and 5. However, this requires that the converter 15 have the same characteristics or the same design, respectively, as the converters 2 and 5, which can be accomplished by constituting all of the converters as integrated circuits on a common semiconductor chip.

The respective frequency which is set at each oscillator 1 and 4 is equal to the reference frequency of the signal from source 16 multiplied by the ratio of the respective control voltage $U_{ST1}$ or $U_{ST2}$ for that oscillator to the reference voltage $U_{REF}$ produced by the converter 67. The dividing ratio of potentiometer 10 of control arrangement 9 is therefore made equal to the ratio of received frequency to reference frequency. That means that a received frequency can always be associated with the voltage of the slider at potentiometer 10. If a voltage corresponding to the intermediate frequency is added to the slider voltage of the potentiometer, the result is a control voltage $U_{ST1}$ at the input of comparator 3 which corresponds to the desired frequency of the receiver oscillator. Thus, this desired frequency is also inevitably produced in the oscillator of the first loop.

The reference signal from source 16 has a frequency, for example, which lies above the highest frequency of the oscillator output signal fed to converter 2. The signal voltages must, of course, be selected to enable the pulse shaping stages of the converters to respond fully. The reference converter 15 furnishes the control voltage for the first and second loops via the tuning control arrangement 9. Since the adverse influences on all converters can be assumed to be identical, the reference converter 15 will act to compensate, or nullify, adverse influences on the oscillator frequency originating in any one of the circuit units. This occurs independently of the voltage/frequency characteristic of the receiver oscillator 1.

A control signal $U_{pot}$ which is proportional to the radio frequency to which the receiver is tuned is obtained from the slider of the tuning potentiometer 10 and is fed to one input of an amplifier, the amplified signal from which reaches the input of comparator 6 as control signal $U_{ST2}$ and, corresponding to this voltage, determines the desired frequency of the sample oscillator 4. The mechanism is the same as in the first loop.

The resulting frequency of the output from sample oscillator 4 is equal to the received frequency multiplied by the gain of the above-mentioned amplifier.

If the loop voltage $U_{pot}$ were fed directly to the input of comparator 6, the received frequency would be generated in the second loop simultaneously with the receiver oscillator frequency in the first loop. This would result in exact synchronism between oscillator frequency and received frequency. Under the prerequisite that the sample oscillator 4 has the same frequency/voltage characteristic as the input circuit 8, a connection of the control lines can result in synchronism between the frequency of the sample oscillator 4 and the resonant frequency of the input tuning circuit. Since, however, the sample oscillator 4 is not intended to oscillate at the received frequency, the slider voltage of potentiometer 10 is not fed directly to the comparator 6 but is instead amplified so that the resulting higher frequency of the sample oscillator 4 corresponds to the amplifier gain factor. The voltage/frequency characteristic remains the same with respect to the relative change in frequency, however, so that synchronism between the resonant frequency of the input circuit 8 and the receiver oscillator 1 remains in effect.

Figure 3:
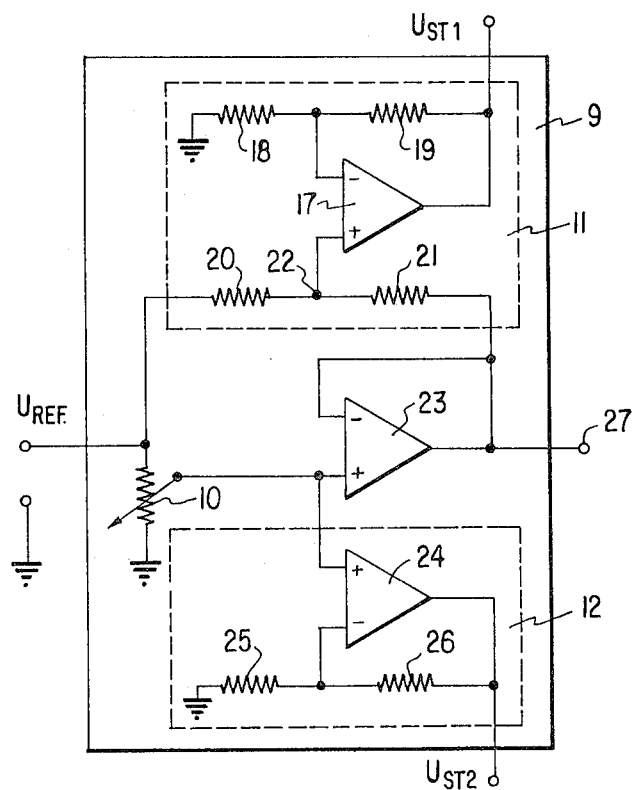
FIG. 3 is a circuit diagram of a unit of the circuits of FIGS. 1 and 2.

FIG. 3 shows details of one preferred embodiment of control arrangements including the adder circuit 11 and the multiplier 12. As shown in FIG. 3, the adder 11 includes an operational amplifier 17 and resistors 18, 19, 20, 21. The resistor 20 leading to the addition point 22 and the non-inverting input of amplifier 17 is connected to reference voltage $U_{ref}$ and resistor 21, which also leads to the addition point 22, is connected to the output and the inverting input of an operational amplifier 23 and thus to $U_{pot}$ appearing at buffer amplifier output terminal 27. The reference voltage $U_{ref}$ produces a constant voltage component of the sum voltage at addition point 22 while the variable potentiometer voltage $U_{pot}$ furnishes the variable portion of the sum voltage. The sum voltage resulting at the addition point 22 is amplified by the amplifier circuit including operational amplifier 17 and resistors 18 and 19. The voltage resulting therefrom is the control voltage $U_{st1}$ for the first frequency control circuit.

The network composed of resistors 18 through 21 and operational amplifier 17 is dimensioned so that $U_{st1} = U_{pot} + U_{FZ}$, $U_{FZ}$ being the voltage corresponding to the intermediate frequency $f_Z$. But there also exists the possibility of making $U_{st1}$ proportional to the sum of $U_{pot}$ and $U_{fZ}$ and providing the required equalization by appropriately designing the first frequency control circuit. This equalization can be realized, for example, by changing the frequency/voltage characteristic of converter 2, but the condition that linearity exist between the voltage furnished by the converter and the frequency at its input must always be met. There also exists the possibility of connecting a frequency divider between the oscillator 1 and the converter 2 or between the oscillator 1 and the mixer stage 7 to produce the required equalization.

The buffer amplifier 23 serves the purpose of preventing the potentiometer 10 from being loaded by the adder 11. There exists the possibility of connecting a frequency display device to the output 27 of buffer 23 to enable the received frequency to be indicated without loading the potentiometer.

The multiplier 12 is designed as an amplifier and includes an operational amplifier 24 and resistors 25 and 26. The control voltage $U_{st2} = m \cdot U_{pot}$ is obtained at the output of the amplifier 24. In the circuit according to FIG. 3 only gains of m>1 are possible. However, it is also possible to employ prior art circuits having gains of m<1.

Figure 4:
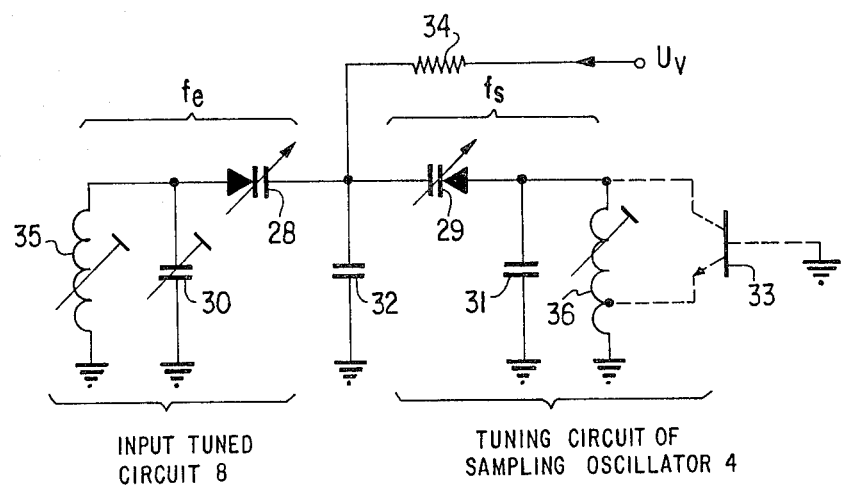
FIG. 4 is a circuit diagram of a preferred embodiment of a portion of the circuits of FIGS. 1 and 2.

FIG. 4 shows the frequency determining resonant circuit, or tuning circuit, of oscillator 4 and the resonant frequency determining components of input tuned circuit 8. In the embodiment of FIG. 4, both resonant circuits are tuned by means of respective varactor diodes 28 and 29. The two varactor diodes must meet the condition that they change their capacitance in the same ratio in response to changes in the tuning voltage $U_V$. This means that the ratio of capacitance of the one varactor diode to the capacitance of the other varactor diode remains constant when there is a change in the tuning voltage within the operating range. This condition indicates that both varactor diodes need not have the same capacitance values but may have different capacitance values.

In order to obtain relative synchronization of the two resonant circuits, the ratio of the parallel capacitance 30 to the capacitance of the varactor diode 28 must be equal to the ratio of the parallel capacitance 31 to the capacitance of the varactor diode 29. To meet this condition, one of the parallel capacitances, in the present case the parallel capacitance 30, is made adjustable.

A further capacitance 32 serves the purpose of decoupling the two resonant circuits. This is accomplished if the capacitance of capacitor 32 is significantly larger than the capacitance of the varactor diodes 28 and 29. Capacitor 32 constitutes a short circuit for the operating frequency. At the same time, the capacitor 32 can be used as a filter capacitor for the control voltage $U_V$. The two varactor diodes 28 and 29 receive the common control voltage $U_V$ via resistor 34. The control voltage $U_V$ can of course also serve to control further resonant circuits. The transistor 33 symbolizes the active portion of oscillator 4.

Setting of the resonant frequency of the input tuned circuit 8 to the received frequency range is effected by means of inductance 35, while the inductance 36 determines, in a manner already described in connection with FIG. 1, the position of the operating range of control voltage $U_V$.

Identity between the varactor diodes, if this is desired, can be most easily achieved by fabricating them on a common semiconductor chip. Inductances 35 and 36 are connected in parallel with respective ones of capacitors 30 and 31 and are selected to have different inductance values in correspondence with the difference between the sampling oscillator frequency $f_s$ and the input tuning circuit resonant frequency $f_e$.

Figure 5:
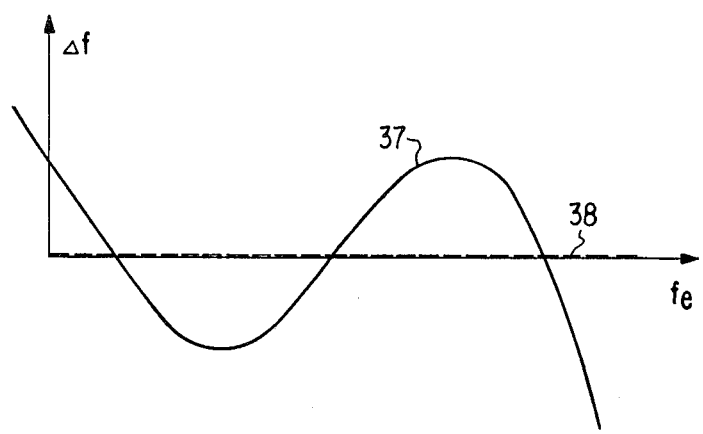
FIG. 5 is a signal diagram illustrating the improvement in signal tracking offered by the present invention.

While in the known tracking circuits the design goal is to have the resonant frequency of the input tuned circuit deviate from the received frequency $f_e$ in accordance with the tracking curve 37 of FIG. 5, so that in this "ideal" case no deviation is present only at three points, the tracking curve generated by a circuit according to the present invention will conform essentially to tracking curve 38, which is practically the same as a perfect tracking curve. Deviations therefrom will, in practice, be slight and will be due primarily to deviations, within manufacturing tolerances, in the operating parameters of the varactors employed in the circuit.

While in the arrangement of FIG. 1 prior art converters having a single input are used, the arrangement according to FIG. 3 utilizes, as already mentioned, novel converters having two inputs as provided by the present invention.

Figure 6:
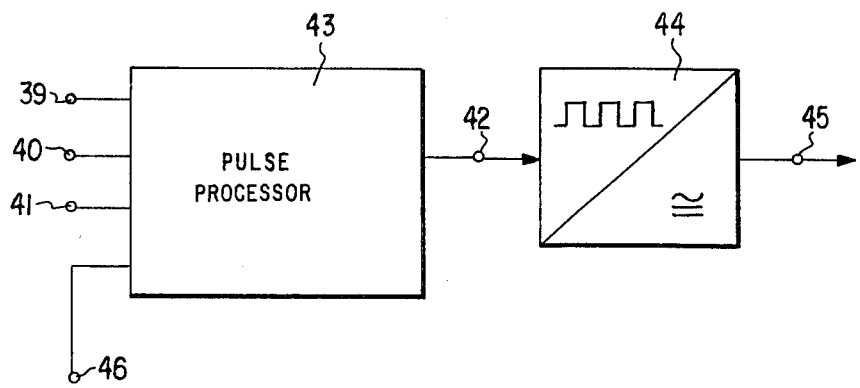
FIG. 6 is a block circuit diagram of one preferred embodiment of a component of the circuits of FIGS. 1 and 2.

FIG. 6 shows a block circuit diagram of one embodiment of such a converter according to the present invention, which can be used for each converter in the arrangement according to FIG. 2. This converter includes a pulse processor 43 followed by an integrator 44. Pulse signals to be processed are fed to inputs 39, 40, 51 of the pulse processor. The output signal produced at the output 42 of the pulse processor is smoothed in integrator 44 and is available as a direct output signal at output 45. The voltage at the output 45 is proportional to the duty cycle of the pulse train at the output 42 of processor 43. Integrator 44 can be eliminated if the pulse train at output 42 can be used directly. The control input 46 of the pulse processor offers an additional possibility for influencing the converter characteristics, e.g. in order to compensate disturbing influences.

Figure 7:
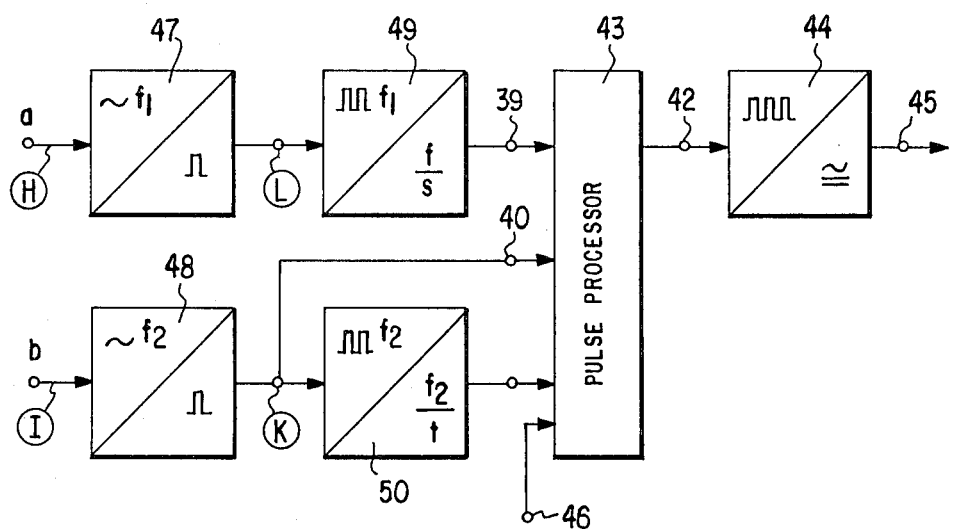
FIG. 7 is a block circuit diagram of a specific form of construction of the device of FIG. 6.

The converter of FIG. 7, compared to the converter of FIG. 6, has two additional pulse formers 47 and 48 as well as two frequency dividers 49 and 50. These additional members are required if the signals for the pulse processor 43 are not available from the start in pulse form but must be processed first. In the embodiment of FIG. 7, the converter is designed to receive two a.c. input signals. With more than two a.c. input signals, a correspondingly larger number of pulse formers and frequency dividers is required. For certain applications, the frequency dividers are preferably designed to each have a programmable dividing ratio.

In the converter of FIG. 7 the first a.c. input signal at frequency $f_1$, which is fed to the input a of the pulse former 47, is converted by this pulse former into a corresponding pulse signal at repetition rate $f_1$. The same applies for the second a.c. input signal at frequency $f_2$ at the input b of pulse former 48, which is converted by this pulse former into a corresponding pulse signal at repetition rate $f_2$. Since the pulse processor 43 can optimally process only pulses in a certain frequency range or a certain frequency relationship between input signals, respectively, the two frequency dividers 49 and 50 are required in case the frequencies $f_1$ and $f_2$ of the a.c. input signals are too high or have a relationship which is unsuitable for processing in the pulse processor. The pulse signals furnished by frequency dividers 49 and 50 at repetition rates $f_1/s$ and $f_2/t$ are fed to the inputs 39 and 41 of the pulse processor 43. The third input 40 of the pulse processor 43 receives the output signal from the pulse former 48 directly.

The output signal produced at the output 42 of the pulse processor is applied, as already explained in connection with FIG. 6, to the input of the integrator 44. The output 45 of the integrator furnishes a smoothed output signal. The forth input 46 is identical with the control input 46 of FIG. 6.

If each of converters 2 and 5 of the circuit of FIG. 1 were constituted by the pulse processor of FIG. 7, then, typically, the associated oscillator output would be supplied to input a of pulse former 47 and the FIG. 1 circuit would be supplemented by a stable reference frequency source, such as source 16 of FIG. 2, whose output is connected to input b of the pulse former 48 of each converter. The output at terminal 45 would be connected to one input of the corresponding comparator 3 or 6.

The pulse shapers and frequency dividers used in the converters, as well as the integrator, can all be constituted by well-known, commercially-available circuit components.

The pulse processors according to the invention are designed so that one input pulse signal thereto controls the pulse rate of its output signal while the other input pulse signal thereto controls the width of each pulse of its output signal, in that the pulse rate of the output signal of the pulse processor is proportional to the pulse rate of the one input pulse signal and the pulse width of the output signal of the pulse processor is proportional to the period of the other input signal. Therefore, the d.c. component of the output signal of the pulse processor is directly proportional to the frequency, or repetition rate, of the one input signal and inversely proportional to the frequency, or repetition rate, of the other input signal. Since the period of the input signal determining the pulse width is inversely proportional to the repetition rate thereof, the value of the d.c. component of the pulse processor output signal will be inversely proportional to the repetition rate of the input signal determining the pulse width.

A pulse processor having the above-mentioned capability can be constituted, for example, by a combination of three circuit units which are, for example, flip-flops having the characteristics to be listed below or by a combination of units with the characteristics to be described below. Two of the three flip-flops are identical to one another and can be so-called D-flip-flops which have the characteristic that a rise in the edge of a clock signal at their clock input transfers a signal value present at the data input D to the output Q of the flip-flop. Each flip-flop must further operate such that a positive pulse at its reset input sets the flip-flop to the state in which a logic zero ("0") is present at its output Q and a logic one ("1") is present at its output $\overline{Q}$. In the example to be described below, for example, the positive edge of a clock signal actuates the signal transfer and a positive edge of the reset signal effects resetting of the flip-flop. The third flip-flop is a so-called JK-flip-flop whose operating behavior is such that a pulse train at half the frequency of its clock signal appears at its output if a corresponding logic "1" signal is present at the J and K inputs, and a constant signal appears at its output if a logic "0" signal is present at the J and K inputs.

FIG. 8 shows an embodiment of such a pulse processor according to the invention. The pulse processor of FIG. 8 includes as mentioned above, two D-flip-flops 56 and 57, a JK-flip-flop 55, and an inverter 58. In the pulse processor of FIG. 8 the flip-flop 55 is a known flip-flop of the JK-master-slave type, while the other two flip-flops 56 and 57 are known D-flip-flops. The one input pulse signal for the pulse processor is fed to the clock input of flip-flop 57 while the other input pulse signal is supplied via line 41 from the output of divider 50 to both the input of inverter 58 and the clock input of flip-flop 55.

The two inputs J and K of flip-flop 55 are connected to the direct output Q of flip-flop 57. The inverting output $\overline{Q}$ of the flip-flop 55 is connected with the clock input of the flip-flop 56. The direct output Q of the flip-flop 56 is connected with the reset input of the flip-flop 57. The direct output Q of the flip-flop 55 is connected to the output 42 of the pulse processor. The D inputs of flip-flops 56 and 57 as well as the $V_{CC}$ input of the flip-flop 55 are flip-flop control inputs which are connected together to control input 46, which in this embodiment provides a constant supply voltage. The reset input of the flip-flop 56 is connected to the output of inverter 58.

Figure 9:
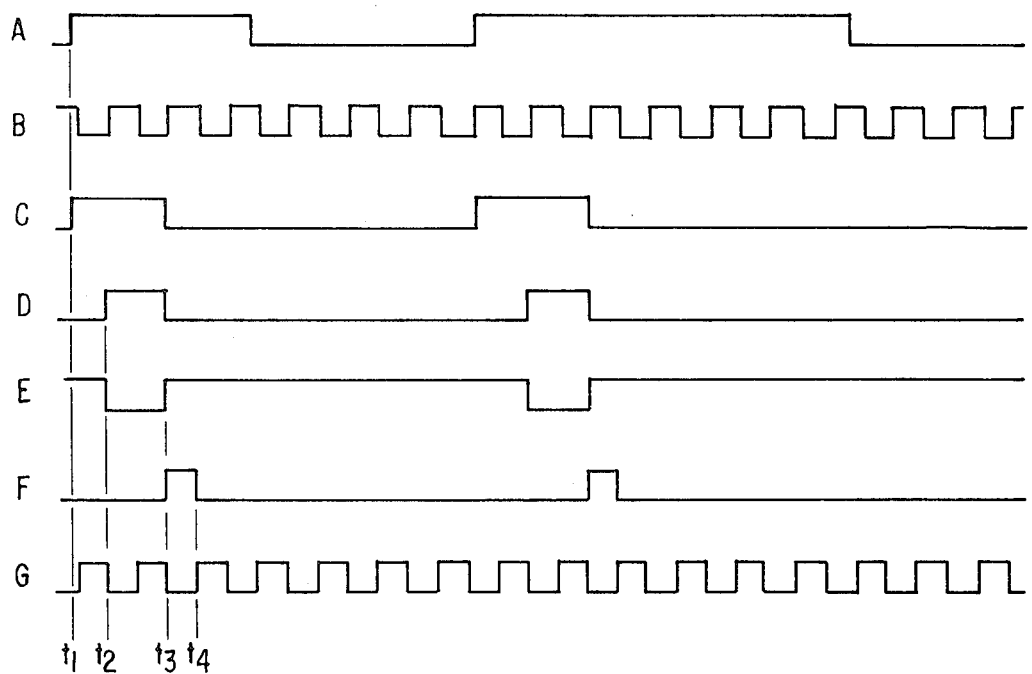
FIGS. 9 and 10 are signal diagrams illustrating the waveforms appearing at different points in the circuit of FIGS. 7 and 8.

FIG. 9 illustrates the operation of the circuit of FIG. 8, with each signal waveform representing the signal at a point in the circuit of FIG. 8 identified by the same letter. The input pulse signals A and B shown in FIG. 9 already have such a frequency relationship that they can be applied directly to the inputs of the pulse processor of FIG. 8 to produce at its output the desired frequency dependency of its output signal relative to the input signals.

If the pulse signal A of FIG. 9 is applied via processor input 39 to the clock input of flip-flop 52 of FIG. 8, the positive edge of this signal appearing at time $t_1$ causes the signal C at the direct output Q of flip-flop 57 to assume the level present at its input D and corresponding to the logic level "1". This also sets the JK inputs of flip-flop 55 to the logic level "1" and flip-flop 55 is enabled for binary frequency division of its clock signal, represented by signal B in FIG. 9. If now a positive edge of signal B arrives at the clock input of flip-flop 55, the output Q of this flip-flop, which provides signal D, is set, at time $t_2$, to the logic level "1". This state continues until the next positive edge of the clock signal B arrives at time $t_3$.

When at time $t_3$ a negative edge appears at the output Q of flip-flop 55, a corresponding positive pulse rise simultaneously appears in signal E at its inverting output $\overline{Q}$, which signal is fed to the clock input of flip-flop 56 and thus produces the logic level "1" in signal F at the direct output Q of flip-flop 56. This pulse at the direct output Q of flip-flop 56 is fed to the reset input of flip-flop 57 and causes the logic level at the direct output Q of flip-flop 57 to be set to logic zero ("0").

Since the direct output Q of flip-flop 57 is connected to both the J-input and the K-input of flip-flop 55, setting of the logic level at the output Q of flip-flop 57 (signal C) to zero causes flip-flop 55 to be likewise set to zero at its direct output Q (signal D).

The described pulse sequence is repeated whenever a new positive pulse edge in signal A arrives at the clock input of flip-flop 57.

The above-described logic linkage has the result that, as shown in FIG. 9, every individual pulse in signal A has associated with it only one pulse in signal D, which is independent of the length of the signal A pulse. Fig. 9 further shows that the width of each pulse signal D is equal to the period of signal B since both the start and stop of each signal D pulse is controlled by successive positive edges of signal B. In the embodiment of FIG. 9, the period of signal B is equal to $t_3-t_2$.

The inverter 58 of the pulse processor of FIG. 8 serves the purpose of inverting the signal fed to input 40, which according to one connection possibility is signal B, and of then feeding the inverted signal G to the reset input of flip-flop 56. Signal G acts to promptly reset flip-flop 56 while assuring that each positive pulse in signal F will be sufficiently long to reset flip-flop 57. For certain types of semiconductor construction, the magnitude of the signal applied to input 46 can be varied over a limited range to control the pulse height of the pulse processor output signal present at output 42. Such a signal thus provides a further control of the d.c. component of this output signal.

Figure 10:
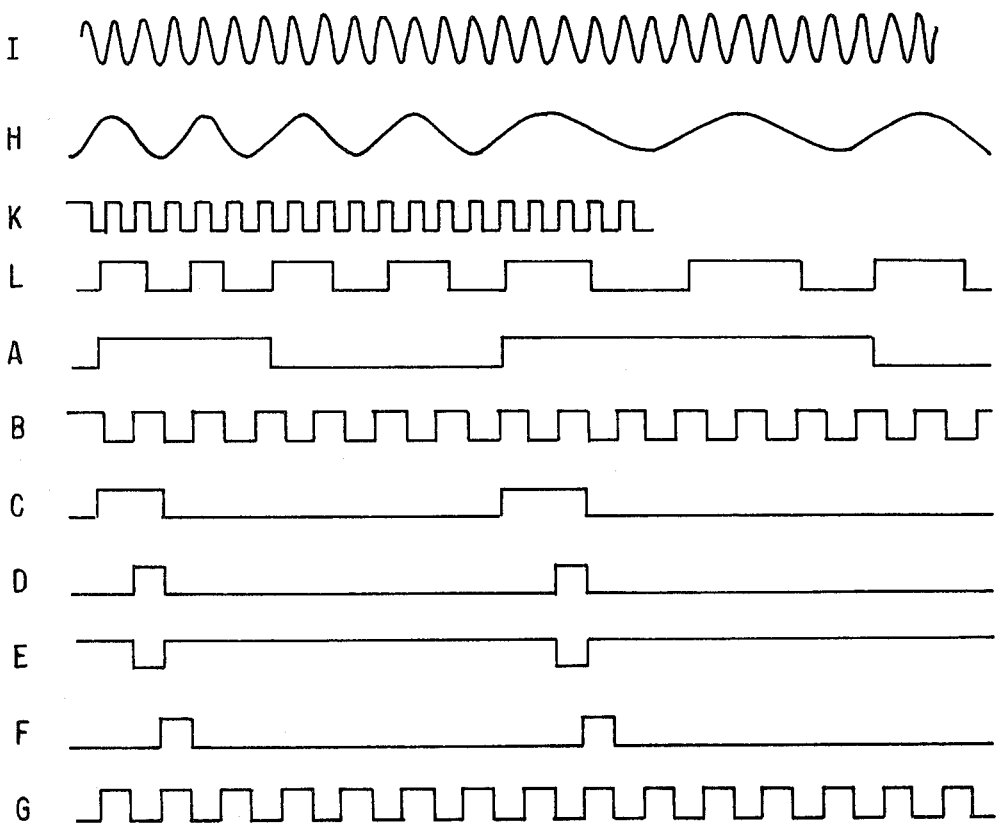

FIG. 10 presents a series of signal waveforms, in addition to the signals A–G of FIG. 9, which were produced by pulse shaping and frequency division. The additional waveforms in FIG. 10 include a sinusoidal signal H representing the first a.c. input signal at input a of the converter of FIG. 7 and a sinusoidal signal I representing the second a.c. input signal at the input b of the converter of FIG. 7. The corresponding outputs of pulse formers 47 and 48 are represented by waveforms L and K, respectively. It will be seen that signal A contains a pulse train at one-fourth the repetition frequency of signal L, while signal B contains a pulse train at one-half the frequency of signal K. Thus, the illustrated signal waveforms relate to an embodiment of the circuit of FIG. 7 in which the frequency dividers have division ratios corresponding to S=4 and t=2.

FIG. 11 shows the relationship between the d.c. component of the output signal from a converter according to the invention and the ratio $f_1/f_2$, where $f_1$ is the frequency of the first a.c. input signal and $f_2$ is the frequency of the second a.c. input signal. According to FIG. 11, the relationship $$V = K_1 + K_2 \cdot f_1/f_2$$

defines the d.c. component V of the converter output signal. The constant $K_1$ results from the intersection of the characteristic with the ordinate. The constant $K_2$ corresponds to the slope of the characteristic.

As is evident from FIG. 11 and also from the relationship $$V = K_1 + K_2 \cdot f_1/f_2,$$

there exists a linear relation between the value of the d.c. component V and the frequency relationship $f_1/f_2$. This is equivalent to the fact that the d.c. component is proportional to the relationship $f_1/f_2$. This relationship can generally be achieved over a wide frequency range. Even if small deviations from the straight line of FIG. 11 should occur, the invention offers significant improvements compared to prior art arrangements. As is evident from the relationship $V = K_1 + K_2 \cdot f_1/f_2$, the dependency of the d.c. component upon the frequency relationship remains the same even if the difference between $f_1$ and $f_2$ remains constant.

FIG. 12 shows the output pulse signal D from a pulse processor according to the invention. By integrating the pulse signal D, the substantially triangular waveform signal 64 is obtained. This signal exhibits fluctuations which depend on the time constant or integration smoothing. Ideal smoothing would result in the signal 65 shown by a broken line representing the d.c. component of the output signal which has been mentioned throughout this description. This d.c. component could be indicated, for example, by a moving coil instrument which is known to provide an average indication.

Figure 13:
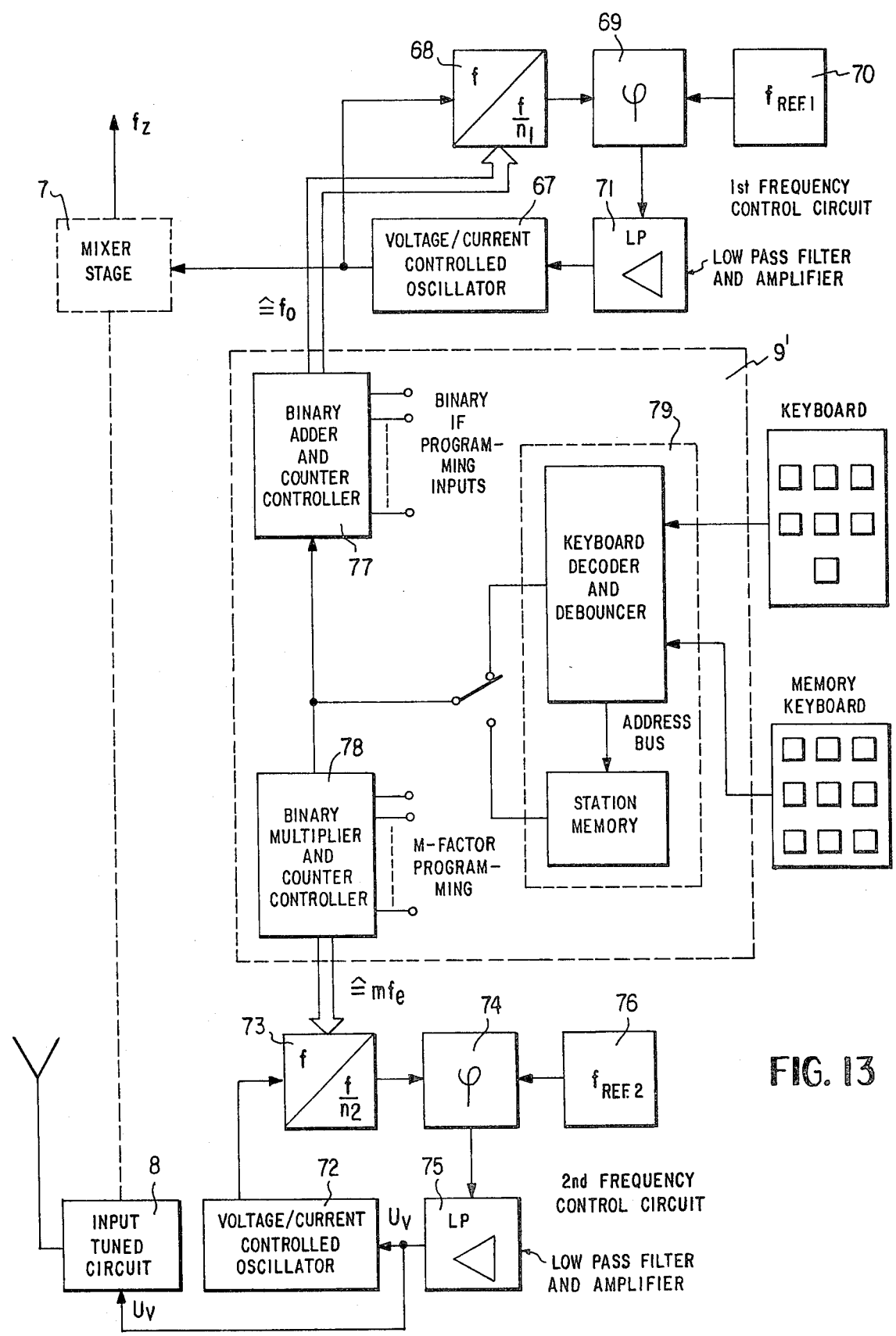
FIGS. 13 and 14 are block circuit diagrams of further preferred embodiments of a tracking circuit according to the invention.

The sync circuit of FIG. 13 differs from the sync circuits of FIGS. 1 and 2 by different types of frequency control circuits which, in contradistinction to the arrangements of FIGS. 1 and 2 require only digital control. The two frequency control circuits of FIG. 13 are known PLL control circuits. The first frequency control circuit, which furnishes the oscillator frequency, includes a controllable oscillator 67, a programmable frequency divider 68, a frequency/phase comparator 69, a reference frequency source 70 and a lowpass filter and amplifier 71.

The second frequency control circuit, which furnishes the control signal $U_V$ for the reactance element of the input tuned circuit 8, includes a controllable oscillator 72, a programmable frequency divider 73, a phase-frequency comparator 74, a reference frequency source 76 and a lowpass filter with amplifier 75.

Both control circuits can be controlled by varying the dividing ratio of the programmable divider 68 or 73, respectively. The control is effected analogously to FIGS. 1 and 2 by a control arrangement 9' which, however, furnishes digital, rather than analog, signals. In agreement with FIGS. 1 and 2, a digital signal is produced to control the first frequency control circuit to set a frequency at the output of oscillator 67 which is equal to the sum or difference of the received frequency $f_e$ and the intermediate frequency $f_z$, or is proportional to this sum or difference frequency. Two digital signals are here added or subtracted in digital adder 77, one signal corresponding to the received frequency $f_e$ and the other to the intermediate frequency $f_z$ of the superheterodyne receiver. An oscillator frequency $m \times f_e$ is generated in the second frequency control circuit with the aid of the digital multiplier arrangement 78.

Binary adder 77 and binary multiplier 78 can be constituted by well-known digital circuits connected to perform such arithmetic operations.

The second input to adder 77 will normally be preset during construction of the tracking circuit or of the overall receiver in accordance with the intermediate frequency value of the particular receiver. The provision of a binary adder having a settable second input is advantageous when a particular tracking circuit model is fabricated for installation in several different models of receiver.

The signal from adder 77 varies with the value of $f_e$ selected by the user and acts digitally on frequency divider 68 in a manner to establish the relationship $$n_1 = (f_e - f_z)/f_{ref1}$$

The second input to multiplier 78 will similarly be normally preset during construction of the tracking circuit in accordance with the voltage-frequency characteristics of tuned circuit 8 and sampling oscillator 72 such that with $$n_2 = f_s/f_{ref2},$$

where $f_s$ is the frequency of the output signal produced by oscillator 72, the value of $U_V$ which causes the frequency of the output of oscillator 72 to equal $n_2 f_{ref2}$ will act to tune input circuit 8 to the frequency value $f_e$. As $U_V$ varies, the value of $f_e$ to which circuit 8 is tuned will vary in proportion to the frequency $f_s$ being produced by oscillator 72, so that the desired conditions are established if m is selected to equal $f_s/f_e$.

The digital input signal representative of the desired value of $f_e$ is supplied by a memory 79 whose output can be selectively connected to the output of a keyboard decoder and debouncer circuit or the output of a station memory connected to the decoder circuit by an address bus. Input to memory 79 can be provided either by a keyboard into which the desired station frequency is punched or by a memory keyboard arranged to feed in a preselected station identification. The components of memory 79 and the keyboards can be constituted by known units currently employed in digitally controlled receivers.

Figure 14:
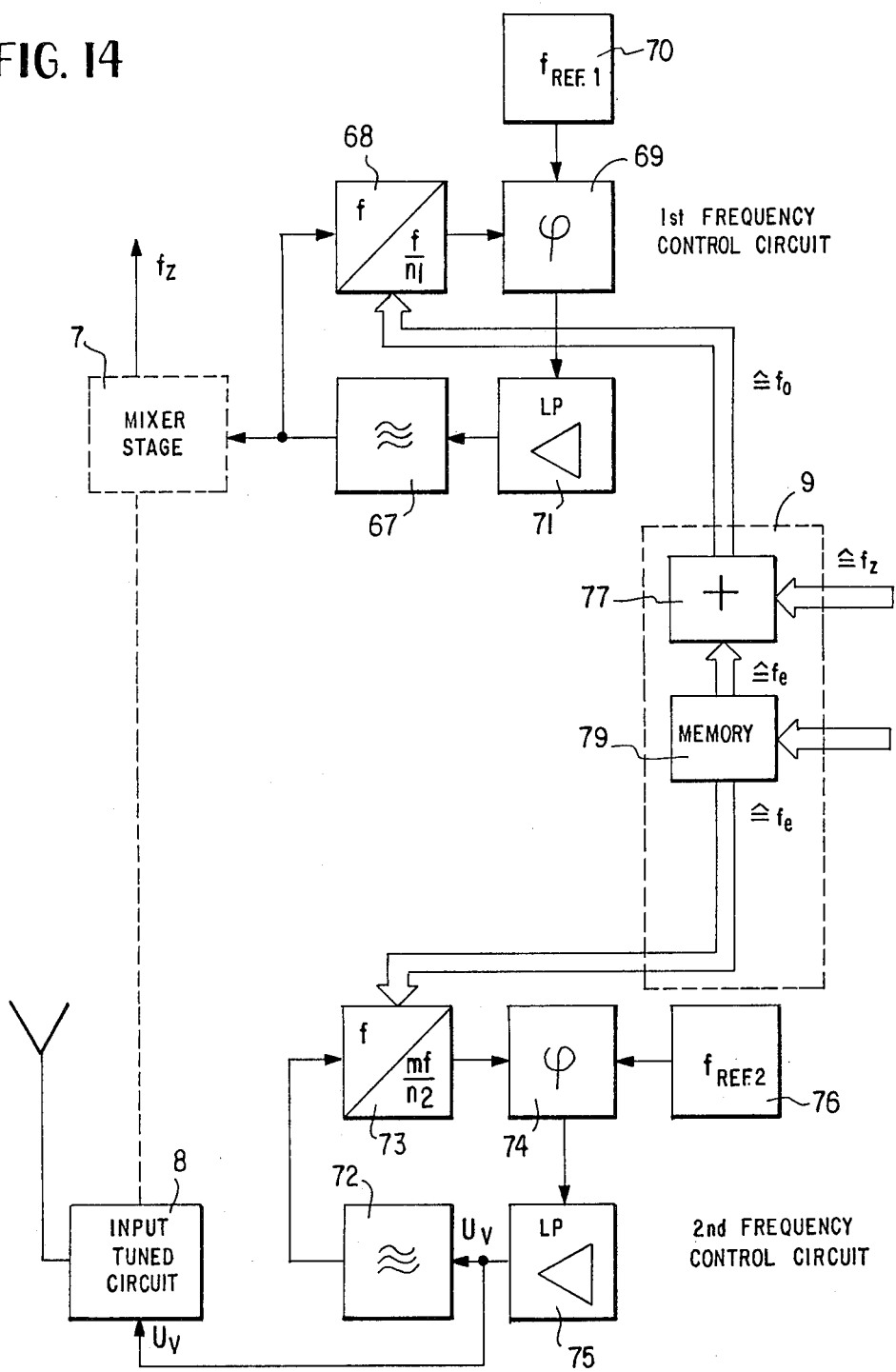

The circuit of FIG. 14 differs from that of FIG. 13 in that instead of the multiplier 78 in the control arrangement 9' of FIG. 13, the second frequency control circuit is provided with a frequency divider 80 having a dividing ratio of $N_2/M$. The frequency divider 80, like the multiplier 78 of FIG. 13, takes care that the frequency of the output of oscillator 72, generated in the second frequency control circuit is equal to m times the received frequency $f_e$.

Figure 15:
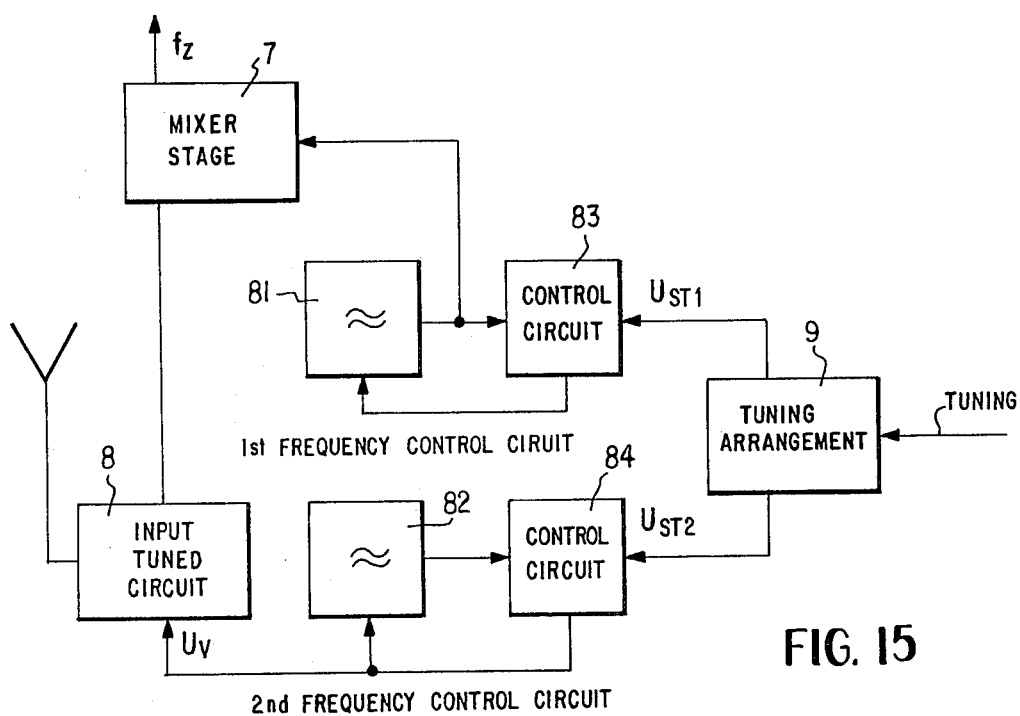
FIG. 15 is a block circuit diagram of the general arrangement of tracking circuits according to the invention.

FIG. 15 again shows the basic circuit diagram of a tracking circuit according to the invention in which each frequency control circuit may be analog controlled or digitally controlled according to various ones of the techniques employed in the above-described specific embodiments.

Figure 16:
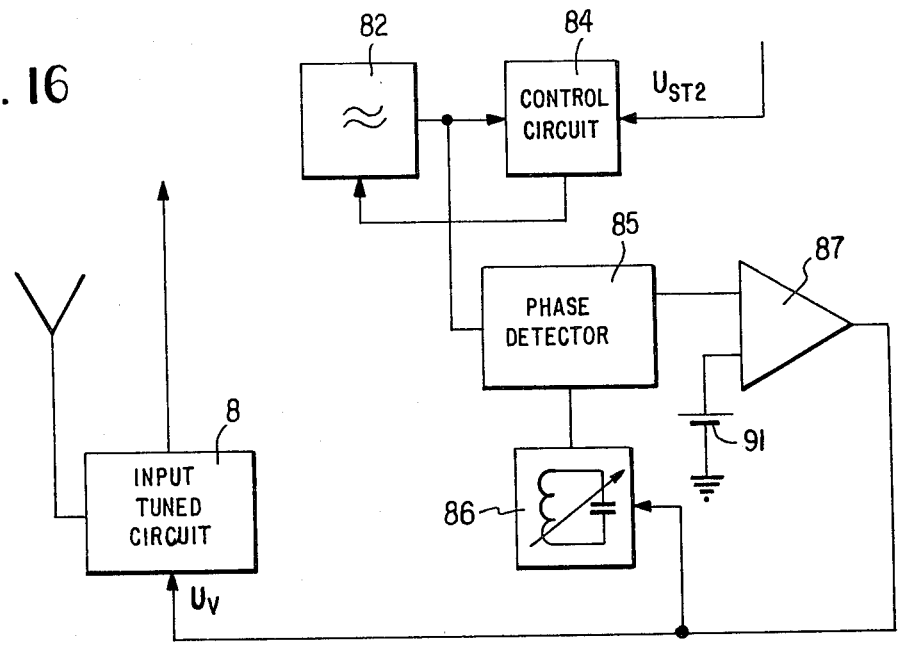
FIG. 16 is a block circuit diagram of a further preferred embodiment of a portion of a tracking circuit according to the invention.

While in the previous arrangements the control signal ($U_V$) for the sampling oscillator of the second frequency control circuit is equal to the control signal for the reactance element of the input tuned circuit, in the circuit of FIG. 16 the control signals ($U_V$) for the reactance element of the input tuned circuit 8 are generated by a phase control circuit including a phase detector 85, a sampling resonant circuit 86 and a comparator 87. The frequency signal for the phase control circuit is furnished by the oscillator 82. In phase detector 85 the phase of the frequency signal furnished by oscillator 82 is compared with the phase of the frequency signal appearing in the sampling resonant circuit 86. At the output of the phase detector 85, an output signal appears which corresponds to the phase difference between the two above-mentioned frequency signals. This output signal is applied to one input of comparator 87, in which it is compared with a signal which originates from a signal source 91 and corresponds to a certain phase difference.

The control signal produced at the output of comparator 87 assures that the sampling resonant circuit 86 will be tuned in a direction which tends to reduce any difference between its resonant frequency and the frequency of the output signal from oscillator 82. The control signal $U_V$ for the sampling resonant circuit 86 is simultaneously the control signal for the input tuned circuit 8.

As in the preceding embodiments, the condition must be met here that the controlled reactance elements of the sampling resonant circuit 86 and of the input tuned circuit 8 have the same control signal/reactance characteristics. Resonant circuit 86 can have the same form as that shown in FIG. 4 for the tuning circuit of oscillator 4.

Figure 17:
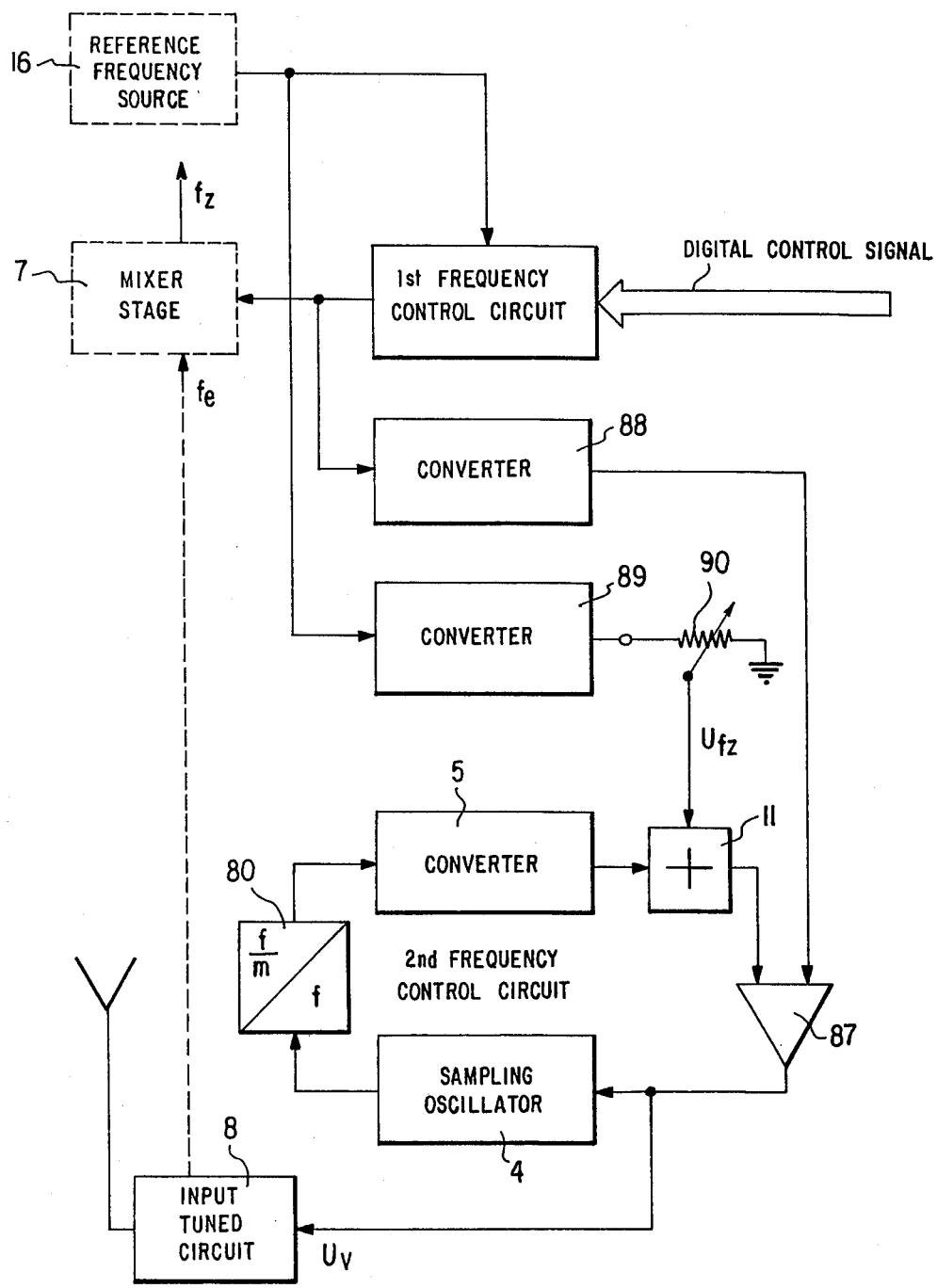
FIG. 17 is a block circuit diagram of another preferred embodiment of a tracking circuit according to the invention.

FIG. 17 shows a sync circuit having a digitally controlled first frequency control circuit. The first frequency control circuit of FIG. 17, which is digitally controlled and is driven by a signal from reference frequency source 16, furnishes the oscillator signal for mixer stage 7. This oscillator signal simultaneously serves to actuate the second frequency control circuit.

The second frequency control circuit includes the converter 5, the analog adder 11, a comparator 87, the sampling oscillator 4 and the frequency divider 80. The second frequency control circuit is actuated via converters 88 and 89. The converter 88 is actuated by the oscillator signal of the first frequency control circuit while the converter 89 is actuated by the reference frequency source 16.

At its output, the converter 88 furnishes a d.c. signal which is proportional to the frequency of the oscillator signal of the first frequency control circuit. Converter 89 furnishes at its output a d.c. signal which is proportional to the frequency of the signal from the reference signal source 16. The output signal from converter 89 is fed to a potentiometer 90 whose movable tap provides the voltage $U_{fz}$ corresponding to the intermediate frequency, which voltage is fed to adder 11 which is part of the secondary frequency control circuit. In adder 11, the output signal of converter 5 and the signal $U_{fz}$ corresponding to the intermediate frequency are added to form a sum signal and this sum signal is fed to one input of comparator 87. The other input of comparator 87 receives the output signal of converter 88.

The second frequency control circuit adjusts itself in such a way that a signal whose frequency is equal to the received frequency $f_e$ is present at the input of converter 5. The frequency divider 80, which divides down the frequency of the output signal furnished by the sampling oscillator 4, assures that the sampling oscillator 4 can operate at an output frequency of m times the received frequency in order to prevent malfunctions. As already mentioned, here again a multiplier can be provided, instead of the frequency divider 80, in the analog circuit.

Figure 18:
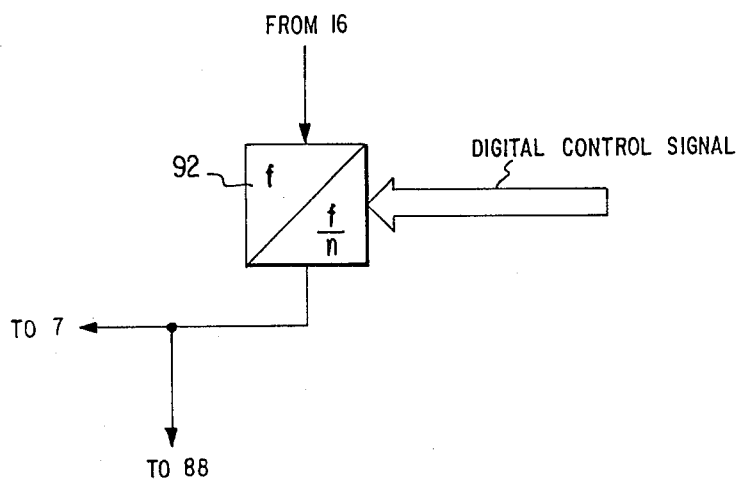
FIGS. 18 and 19 are block circuit diagrams of two exemplary embodiments of one of the components of the circuit of FIG. 17.
Figure 19:
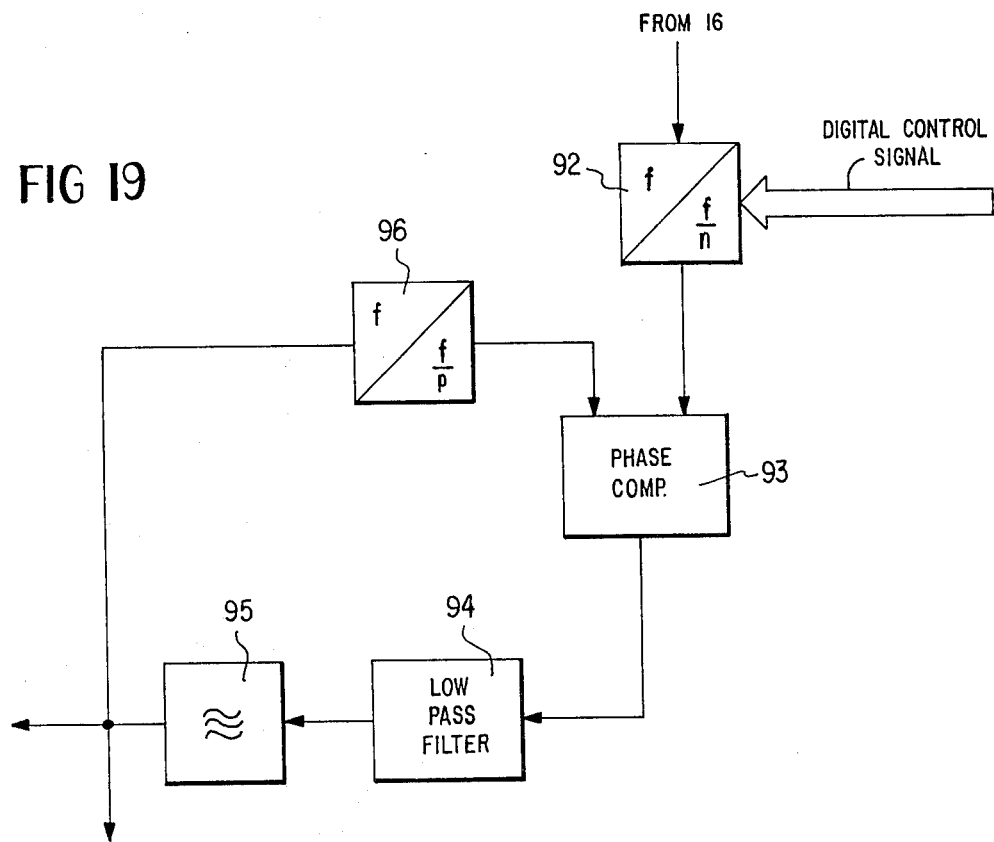

Two exemplary embodiments of the first frequency control circuit for the system of FIG. 17 are shown in FIGS. 18 and 19. In the comparatively simple embodiment illustrated in FIG. 18, the control circuit is constituted by a digitally programmable frequency divider 92 whose dividing ratio, n, is determined by the digital control signal applied thereto. Such programmable frequency dividers are already quite well known in the art. The embodiment illustrated in FIG. 19 includes, in addition to frequency divider 92, a phase comparator 93 having its output connected to a lowpass filter 94 which provides an output signal representative of the d.c. component of the output signal from comparator 93. The output from filter 94 is supplied to a voltage controllable oscillator 95 which provides the local oscillator signal. The inputs to phase comparator 93 are provided by the output of frequency divider 92 and the output of a preset frequency divider 96 receiving the local oscillator signal from oscillator 95. Phase comparator 93 operates in a known manner to adjust the output frequency from oscillator 95 in a direction to reduce any frequency difference between the two phase comparator input signals. Preset frequency divider 96 permits any necessary compensation to be made for differences between the frequency of the output from reference source 16 and the desired range of local oscillator frequencies. If the reference frequency value is appropriately selected, divider 96 can be eliminated.

In the operation of both embodiments, the value of the local oscillator frequency is selected simply by supplying to the digital control inputs of frequency divider 92 a digital, e.g. binary, signal representative of the frequency to which the receiver is to be tuned. The manner in which such digital signals are derived and employed to control the division ratio of a programmable voltage divider are well known in the art.

It will be understood that the above description of the present invention is susceptible to various modifications, changes and adaptations, and the same are intended to be comprehended within the meaning and range of equivalents of the appended claims.

What is claimed is:

1. In a superheterodyne signal receiver including an input circuit arranged to be tuned to a frequency to be received and including a signal controllable variable reactance element presenting a reactance whose value is adjusted by a tuning signal and determines the frequency to which the input circuit is tuned, and controllable means for producing a first alternating signal to be mixed with a received signal to produce an intermediate frequency signal, a synchronizing circuit comprising: a first frequency control circuit including said controllable means; a second frequency control circuit including a controllable sampling oscillator, separate from said controllable means, for producing a second alternating signal separate from the first alternating signal and means connected to respond to the frequency of the second alternating signal from said sampling oscillator to derive a signal related thereto and supplying that signal, as the tuning signal, to said controllable element; and first control signal generating means generating a first control signal and second control signal generating means for generating a second control signal, at least one of which control signals is a digital signal, said first control signal generating means being connected for supplying said first control signal to said first frequency control circuit for adjusting the frequency of the signal produced by said controllable means, and said second control signal generating means being connected for supplying said second control signal to said second frequency control circuit for adjusting the value of said tuning signal to tune said input circuit to a selected frequency, said first and second generating means maintaining a relationship between said first and second control signals such that the output frequency of said controllable means is adjusted to the value corresponding to the received signal frequency to which said input circuit is tuned, wherein at least one of said control circuits includes means connected to control the frequency of its respective alternating signal in response to the at least one digital signal.

2. Circuit arrangement as defined in claim 1 wherein said at least one control circuit is constituted by a PLL control circuit.

3. Circuit arrangement as defined in claim 1 wherein the other one of said control circuits is arranged to control its respective alternating signal in response to an analog signal and said control signal for said other control circuit is an analog signal.

4. Circuit arrangement as defined in claim 1 wherein said controllable means is a controllable local oscillator and said means connected in said at least one control circuit to control the frequency of its respective alternating signal comprises a digitally programmable frequency divider connected to receive the output signal from its respective oscillator and to have its dividing ratio controlled by the value of said digital control signal for said at least one control circuit.

5. Circuit arrangement as defined in claim 4 wherein said at least one control circuit further comprises frequency/phase comparator means having one input connected to the output of said frequency divider, a reference frequency signal source connected to a second input of said comparator means, and low pass filter means connected between the output of said comparator means and said respective oscillator for controlling the output frequency of said respective oscillator.

6. Circuit arrangement as defined in claim 1 wherein said controllable means is a controllable local oscillator.

* * * * *